(12) United States Patent
Fukuda

(10) Patent No.: US 7,855,917 B2
(45) Date of Patent: Dec. 21, 2010

(54) SEMICONDUCTOR MEMORY DEVICE AND DRIVING METHOD THEREOF

(75) Inventor: Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 119 days.

(21) Appl. No.: 12/244,338

(22) Filed: Oct. 2, 2008

(65) Prior Publication Data

US 2009/0091972 A1   Apr. 9, 2009

(30) Foreign Application Priority Data

Oct. 4, 2007   (JP) .............................. 2007-260978

(51) Int. Cl.
*G11C 16/04* (2006.01)
(52) U.S. Cl. .............................. 365/185.14; 365/185.26; 365/185.18; 365/185.24; 365/185.19; 365/185.21
(58) Field of Classification Search ............ 365/185.14, 365/185.26, 185.18, 185.24, 185.19, 185.21
See application file for complete search history.

(56) References Cited

U.S. PATENT DOCUMENTS

| | | | | |
|---|---|---|---|---|
| 6,617,651 | B2 * | 9/2003 | Ohsawa ....................... | 257/366 |
| 6,912,150 | B2 * | 6/2005 | Portman et al. ............. | 365/149 |
| 7,224,024 | B2 * | 5/2007 | Forbes ........................ | 257/329 |
| 7,609,551 | B2 * | 10/2009 | Shino et al. ............. | 365/185.08 |
| 7,646,071 | B2 * | 1/2010 | Ban et al. ................... | 257/404 |
| 7,710,771 | B2 * | 5/2010 | Kuo et al. .................... | 365/184 |

OTHER PUBLICATIONS

Takashi Ohsawa et al, "Design of a 128-Mb SOI DRAM Using the Floating Body Cell (FBC)", IEEE Journal of Solid-State Cirucits, vol. 41 No. 1, Jan. 2006, pp. 135-145.
Takashi Ohsawa et al, "An 18.5ns 128Mb SOI DRAM with a Floating Body Cell", IEEE 2005 International Solid-State Circuits Conference, Digest of Technical Papers, vol. 48, First Edition, Feb. 9, 2005, 5 pages.

* cited by examiner

*Primary Examiner*—Viet Q Nguyen
(74) *Attorney, Agent, or Firm*—Oblon, Spivak, McClelland, Maier & Neustadt, L.L.P.

(57) ABSTRACT

The disclosure concerns a memory including a floating body provided in a semiconductor layer between a source and a drain and storing data; a first gate dielectric provided on a first surface of the body; a first gate electrode provided on the first surface via the first gate dielectric; a second gate dielectric provided on a second surface of the body different from the first surface; a second gate electrode provided on the second surface via the second gate dielectric; a driver driving the first gate electrode and the second gate electrode; and a sense amplifier writing into the memory cells first data showing a sate of a small charge amount in a state that a voltage of the second gate electrode at a data writing time is brought closer to a potential of the source layer than a voltage of the second gate electrode at a data holding time.

5 Claims, 11 Drawing Sheets

WRITE OPERATION OF DATA "1"

FIG. 10  THIRD EMBODIMENT

SEMICONDUCTOR MEMORY DEVICE AND DRIVING METHOD THEREOF

CROSS-REFERENCE TO RELATED APPLICATIONS

This application is based upon and claims the benefit of priority from the prior Japanese Patent Application No. 2007-260978, filed on Oct. 4, 2007, the entire contents of which are incorporated herein by reference.

BACKGROUND OF THE INVENTION

1. Field of the Invention

The present invention relates to a semiconductor memory device and a driving method thereof, and more particularly relates to an FBC (Floating Body Cell) memory storing information by accumulating majority carriers into a floating body of a field-effect transistor.

2. Related Art

In recent years, an FBC memory device is available as a semiconductor memory device expected as a memory substituting an IT (Transistor)-IC (Capacitor) DRAM. The FBC memory device is formed with an FET (Field Effect Transistor) having a floating body (hereinafter, also called a body) on an SOI (Silicon On Insulator) substrate. The FBC memory device stores data "1" or data "0" depending on a size of the number of majority carriers accumulated in this body. For example, in an FBC including an N-type FET, a state that the number of holes accumulated in the body is large is set as data "1" and a state that the number of those holes is small is set as data "0". A memory cell storing the data "0" is called a "0" cell and a memory cell storing the data "1" is called a "1" cell.

In writing the data "1" into memory cells, a high-level potential is applied to word lines and bit lines and holes are accumulated in the body by impact ionization. In writing the data "0" into memory cells, a low-level potential (for example, a source potential (ground potential)) is applied to the bit lines in a state that a word line potential is at a high level. As a result, the holes are extracted from the body to a drain. In this way, in the FBC, the data "1" or the data "0" can be selectively written into plural memory cells connected to a certain selective word line.

In reading data, a sense amplifier detects a difference between driving forces of memory cell transistors due to a difference between a body potential (a signal amount) in the "0" cell and a body potential (a signal amount) in the "1" cell. However, when an operation voltage is lowered by miniaturization in the FBC, a sufficient difference between a body voltage in the "0" cell and a body voltage in the "1" cell cannot be obtained. As a result, a sufficient difference between the signal amount in the "0" cell and the signal amount in the "1" cell cannot be obtained.

That is, when miniaturization is progressed, in the conventional data writing operation, a signal amount cannot be made sufficiently large for the sense amplifier to be able to sufficiently detect the data "0" and the data "1" during the reading operation.

SUMMARY OF THE INVENTION

A semiconductor memory device according to an embodiment of the present invention comprises a semiconductor layer; a source layer and a drain layer provided in the semiconductor layer; a body region provided in the semiconductor layer between the source layer and the drain layer in an electrically floating state, and storing logic data based on a charge amount accumulated therein; a first gate dielectric film provided on a first surface of the body region; a first gate electrode provided on the first surface via the first gate dielectric film; a second gate dielectric film provided on a second surface of the body region different from the first surface; a second gate electrode provided on the second surface via the second gate dielectric film; a driver driving the first gate electrode and the second gate electrode; and a sense amplifier reading logic data from or writing logic data into memory cells including the source layer, the drain layer, and the body region, wherein the sense amplifier writes into the memory cells first logic data showing a sate of a small charge amount in a state that a voltage of the second gate electrode at a data writing time is brought closer to a potential of the source layer than a voltage of the second gate electrode at a data holding time.

A semiconductor memory device according to an embodiment of the present invention comprises a semiconductor layer; a source layer and a drain layer provided in the semiconductor layer; a body region provided in the semiconductor layer between the source layer and the drain layer in an electrically floating state, and storing logic data based on a charge amount accumulated therein; a first gate dielectric film provided on a first surface of the body region; a first gate electrode provided on the first surface via the first gate dielectric film; a second gate dielectric film provided on a second surface of the body region different from the first surface; a second gate electrode provided on the second surface via the second gate dielectric film; a driver driving the first gate electrode and the second gate electrode; and a sense amplifier reading logic data from or writing logic data into memory cells including the source layer, the drain layer, and the body region, wherein the sense amplifier writes first logic data showing a state of a small charge amount into the memory cells, and the sense amplifier holds the first logic data or writing the first logic data showing a state of a large charge amount into the memory cells in a state that a voltage of the second gate electrode is more separated from a potential of the source layer than from the voltage of the second gate electrode at the time of writing the first logic data.

A method of driving a semiconductor device according to an embodiment of the present invention, the device including a semiconductor layer; a source layer and a drain layer provided in the semiconductor layer; a body region provided in the semiconductor between the source layer and the drain layer in an electrically floating state, and storing logic data based on a charge amount accumulated therein; a first gate dielectric film provided on a first surface of the body region; a first gate electrode provided on the first surface via the first gate dielectric film; a second gate dielectric film provided on a second surface of the body region different from the first surface; a second gate electrode provided on the second surface via the second gate dielectric film; a driver driving the first gate electrode and the second gate electrode; and a sense amplifier reading logic data from or writing logic data into memory cells including the source layer, the drain layer, and the body region, the method comprises bringing a voltage of the second gate electrode closer to a potential of the source layer from a voltage of the second gate electrode at the data holding time; writing first logic data showing a state of a small charge amount into the memory cells; returning the voltage of the second gate electrode to the voltage of the second gate electrode in a data holding state; and writing second logic data showing a state of a large charge amount into the memory cells.

DETAILED DESCRIPTION OF THE INVENTION

Embodiments of the present invention will be explained below in detail with reference to the accompanying drawings. Note that the invention is not limited thereto.

First Embodiment

Figure 1:
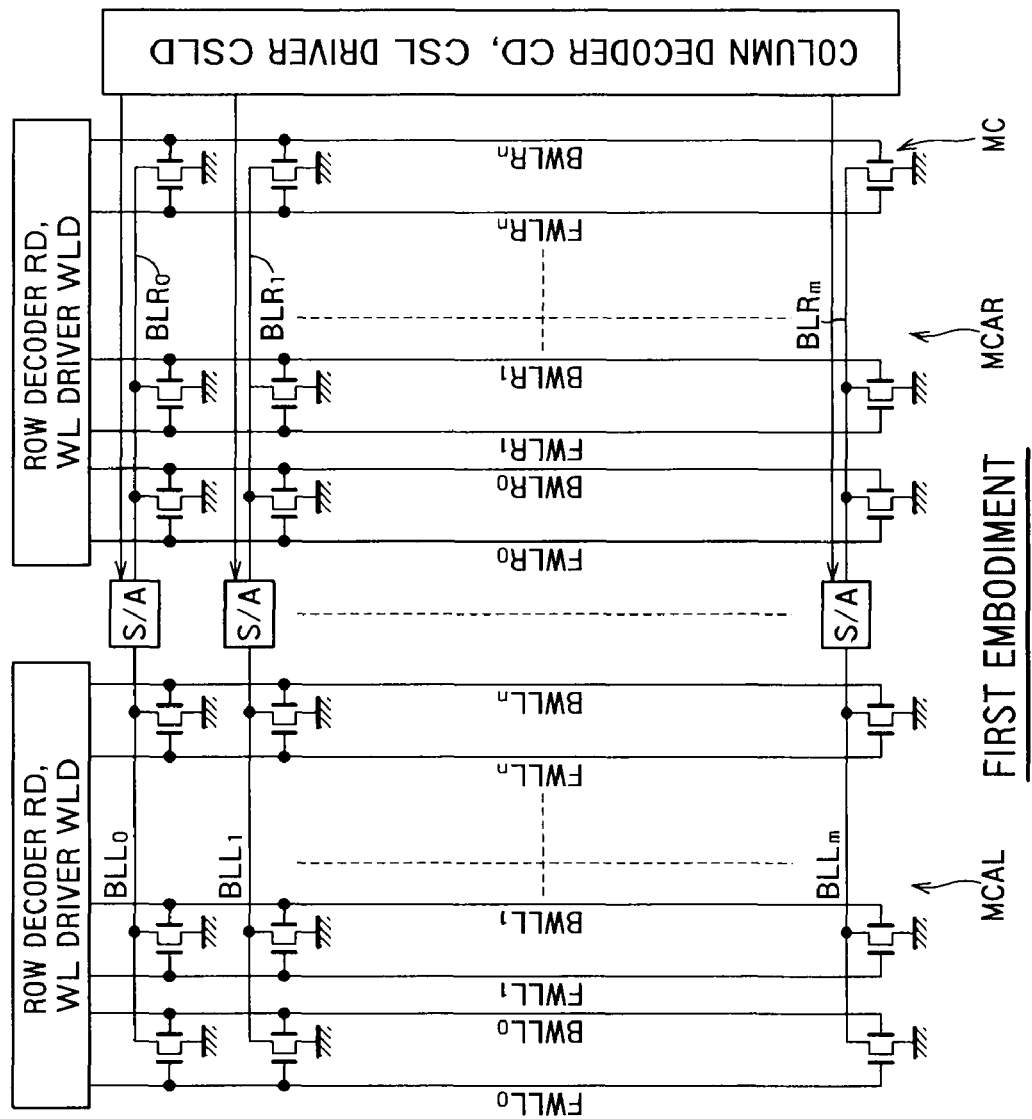
FIG. 1 is a configuration diagram showing one example of an FBC memory according to a first embodiment of the present invention.

FIG. 1 is a configuration diagram showing one example of an FBC memory according to a first embodiment of the present invention. An FBC memory device includes memory cells MCs, front word lines FWLL0 to FWLLn, FWLR0 to FWLRn (hereinafter, also called an FWL), back word lines BWLL0 to BWLLn, BWLR0 to BWLRn (hereinafter, also called a BWL), bit lines BLL0 to BLLm, BLR0 to BLRm (hereinafter, also called BL), a sense amplifier S/A, a row decoder RD, a WL driver WLD, a column decoder CD, and a CSL driver CSLD.

The memory cells MCs are laid out two dimensionally in a matrix shape and constitute memory cell arrays MCAL and MCAR (hereinafter, also called MCA). The front word lines FWLs are extended to a row direction, and function as a front gate (first gate electrode) of the memory cells MCs. The front word lines FWLs are provided by (n+1) at the left side and the right side, respectively of the sense amplifier S/A. The back word lines BWLs are extended to a row direction like the front word lines FWLs, and function as a back gate (a second gate electrode) of the memory cells MCs. The back word lines BWLs are provided by (n+1) at the left side and the right side, respectively of the sense amplifier S/A, like the front word lines FWLs. The back word lines BWLs are provided corresponding to the front word lines FWLs at a one-to-one relationship.

The bit lines BLs are extended to a column direction and they are connected to a source or a drain of the memory cells MCs. The bit lines BLs are provided by (m+1) at the left side and the right side, respectively of the sense amplifier S/A. The front word lines FWLs (the back word lines BWLs) and the bit lines BLs are orthogonal with each other, and the memory cells MCs are provided at intersections of these lines. These cells are called cross-point cells. The row direction and the column direction of these lines can be replaced with each other.

In the data reading and writing operations, one of a pair of the bit lines BLL and BLR connected to both sides of the sense amplifier S/A transmits data of the memory cells MCs, and the other bit line passes a reference current Iref. The reference current Iref is substantially an intermediate current between a current flowing through the "0" cell and a current flowing through the "1" cell. To generate the reference current Iref, dummy cells, dummy word lines, an averaging circuit, and a dummy-cell writing circuit are necessary, but are omitted here. The sense amplifier S/A passes a current to the memory cells MCs via one of the bit lines BLs. As a result, a current corresponding to the data of the memory cells MCs passes through a sense node within the sense amplifier S/A. The sense amplifier S/A identifies a logic value "1" or "0" of data, depending whether the current flowing through the sense node is higher or lower than the reference current Iref. This operation system is called a one-cell/bit (single cell) system.

Alternatively, in the data writing and reading operation, one of data in the pair of bit lines BLL and BLR connected to both sides of the sense amplifier S/A can be set as reference data of the other data, and the other data can be set as reference data of the one data. In this case, two selective memory cells connected to the pair of bit lines BLL and BLR need to store mutually complementary data (data "1" and data "0"). Because the two memory cells store one bit, this operation system is called a two-cell/bit (twin cell) system. The first embodiment can be applied to both the single-cell system and the twin-cell system, and can be also applied to other operation systems.

The sense amplifier S/A reads data from the memory cells MCs, and latches this data. In reading data to the outside of the memory, the sense amplifier S/A outputs to the outside the data latched by the sense amplifier S/A via a DQ buffer (not shown). In writing data from the outside of the memory, the sense amplifier S/A once latches data to be written to the sense amplifier S/A via the DQ buffer. The sense amplifier S/A writes data latched by the sense amplifier S/A into the memory cell MC. In this way, the sense amplifier S/A performs data exchanges (reading and writing) between the memory cells MCs and the sense amplifier SA, and performs data exchanges (reading and writing) between the outside of the memory and the sense amplifier S/A. Hereinafter, "reading" or "writing" means data exchanges between the memory cells MCs and the sense amplifier S/A. The data exchanges between the outside of the memory and the sense amplifier S/A are called reading to the outside or writing from the outside.

The row decoder RD decodes a row address to select a specific front word line out of plural front word lines FWLs. The WL driver WLD applies a voltage to the selective front word line, thereby activating this selective front word line. The row decoder RD decodes a row address to select a specific back word line out of the plural back word lines BWLs. The WL driver WLD applies a voltage to a selective back word line, thereby activating this selective back word line. Row addresses of the back word lines BWLs can be the same as row addresses of the front word lines FWLs. That is, the back word lines BWLs and the corresponding front word lines FWLs form pairs and these word lines are selected for each pair of the word lines FWLs and BWLs (activated).

The column decoder CD decodes a column address to select a specific column out of plural columns. The CSL driver CSLD reads data from the sense amplifier S/A to the outside via a DQ buffer (not shown), by applying a potential to a selected column. When a ground potential or a source potential is set as a reference voltage, a polarity of a voltage shows a voltage from the reference potential to a positive direction or a negative direction. A data polarity shows the complementary data "1" or "0".

Figure 2:
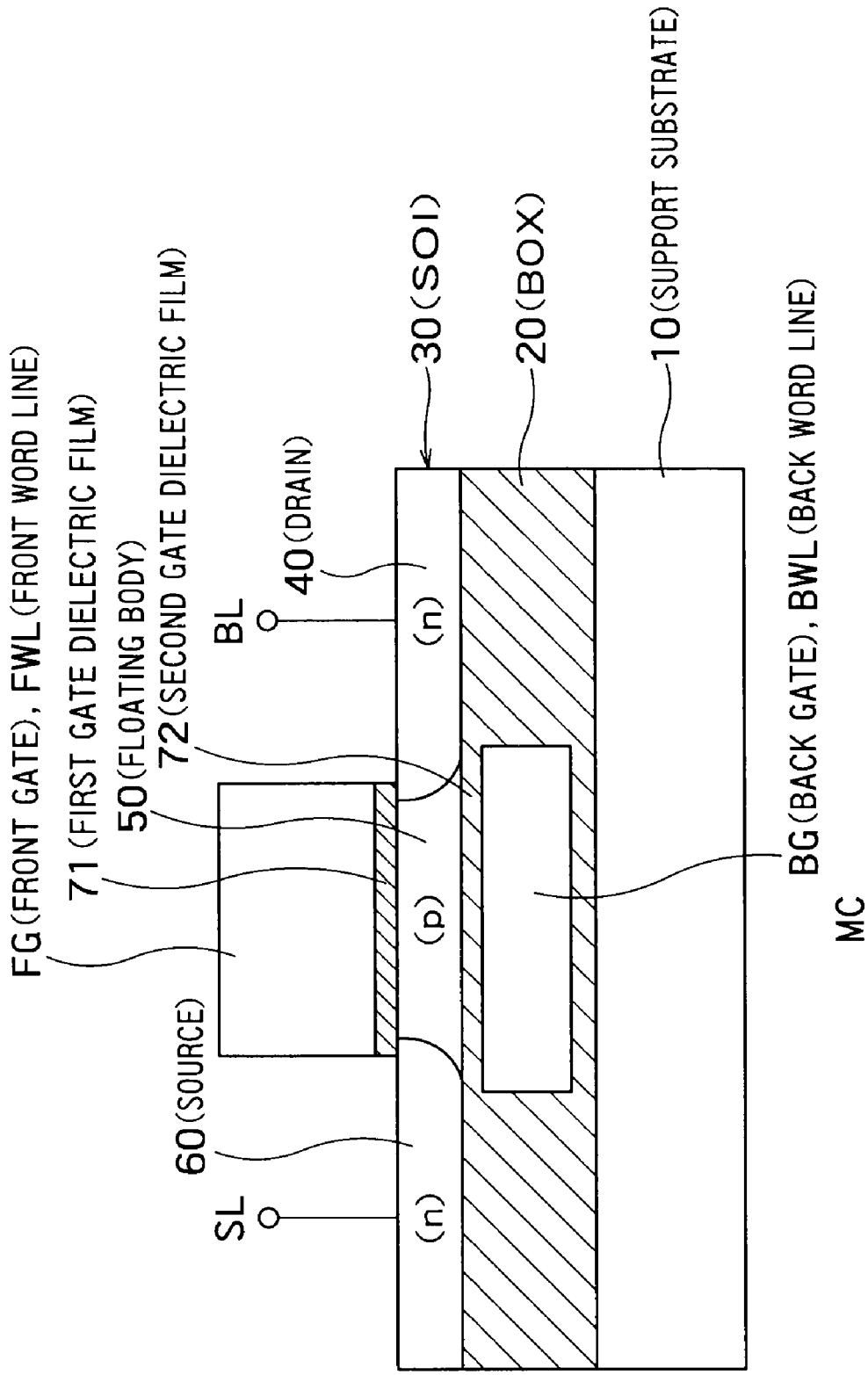
FIG. 2 is a cross-sectional diagram showing one example of a structure of a memory cell MC.

FIG. 2 is a cross-sectional diagram showing one example of a structure of a memory cell MC. The memory cells MCs are provided on an SOI substrate including a supporting substrate 10, a BOX layer 20, and an SOI layer 30. A source 60 and a drain 40 are provided within the SOI layer 30. A floating body 50 is formed within the SOI layer 30 between the source 60 and the drain 40. The body 50 is an inversely conductive semiconductor having an inverse conductivity to that of the source 60 and the drain 40. In the first embodiment, the memory cells MC are an N-type FET. The body 50 is in an electrically floating state, by having a part or the whole of which being surrounded by the source 60, the drain 40, the BOX layer 20, a first gate dielectric film 71, a second gate dielectric film 72, and an STI (Shallow Trench Isolation) (not shown). The FBC memory can store logic data (binary data) based on the number of majority carriers within the body 50.

The first gate dielectric film 71 is provided on an upper surface of the body 50, and the second gate dielectric film 72 is provided on a bottom surface of the body 50 at the opposite side of the upper surface. A front word line (a first gate electrode) FWL is provided on an upper surface of the body 50 via the first gate dielectric film 71. A back word line (a second gate electrode) BWL is provided on the bottom surface of the body 50 via the second gate dielectric film 72. In the first embodiment, the back word lines BWLs are provided by being embedded in the BOX layer 20. A film thickness of the second gate dielectric film 72 can be about the same as that of the first gate dielectric film 71, but is not particularly limited. However, when a film thickness of the second gate dielectric film 72 is equal to a film thickness of the first gate dielectric film 71, both the first and second gate dielectric films 71 and 72 can be formed simultaneously in an Fin-type FBC described later (see FIG. 10 and FIG. 11). Therefore, by setting the film thickness of the second gate dielectric film 72 equal to that of the first gate dielectric film 71, there is an advantage that the Fin-type FBC memory can be easily manufactured.

A data writing operation of writing data into the FBC memory according to the first embodiment is explained next. In writing data into the memory cells MCs from the outside, or in a refresh operation, the sense amplifier S/A once reads data from the memory cells MCs, and then writes the data into the memory cells MCs. When the data from the outside is different from the data read from the memory cells MCs, the sense amplifier S/A writes the data from the outside into the memory cells MCs.

The refresh operation is an operation of recovering degraded data of the "1" cell and the "0" cell. In the refresh operation, the sense amplifier S/A writes data of the same logic as that of the read data into the memory cells MCs. The data writing operation according to the first embodiment can be applied to both the operation of writing data from the outside and the refresh operation.

While data read by the sense amplifier S/A is also restored into the memory cells MCs in reading data to the outside, the data writing operation according to the first embodiment can be also applied to the restore operation. That is, the data writing operation according to the first embodiment can be applied to all operations of writing data from the sense amplifier S/A to the memory cell MC.

Figure 3:
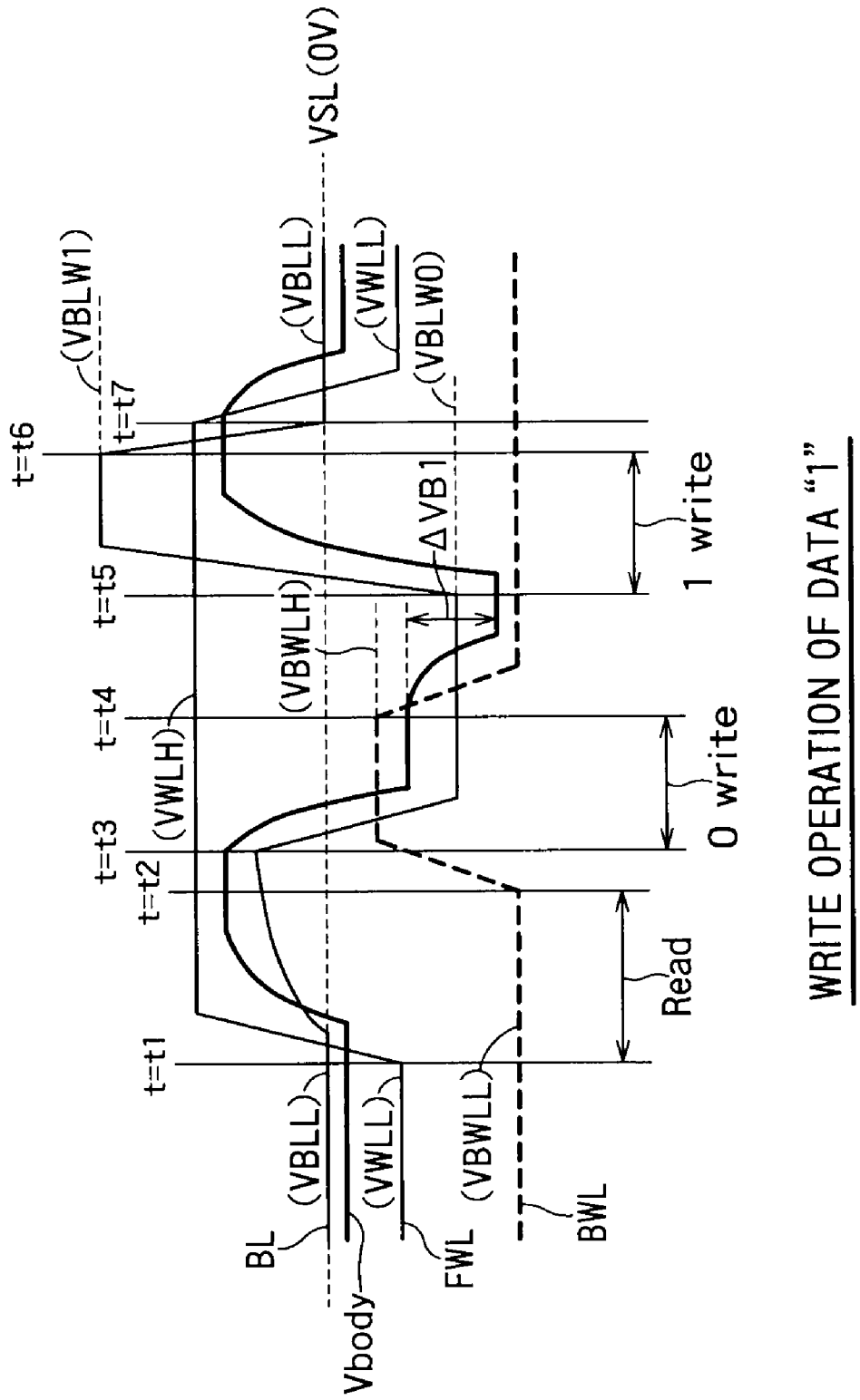
FIG. 3 is a timing diagram showing a writing operation of the data "1" into the memory cells MCs.
Figure 4:
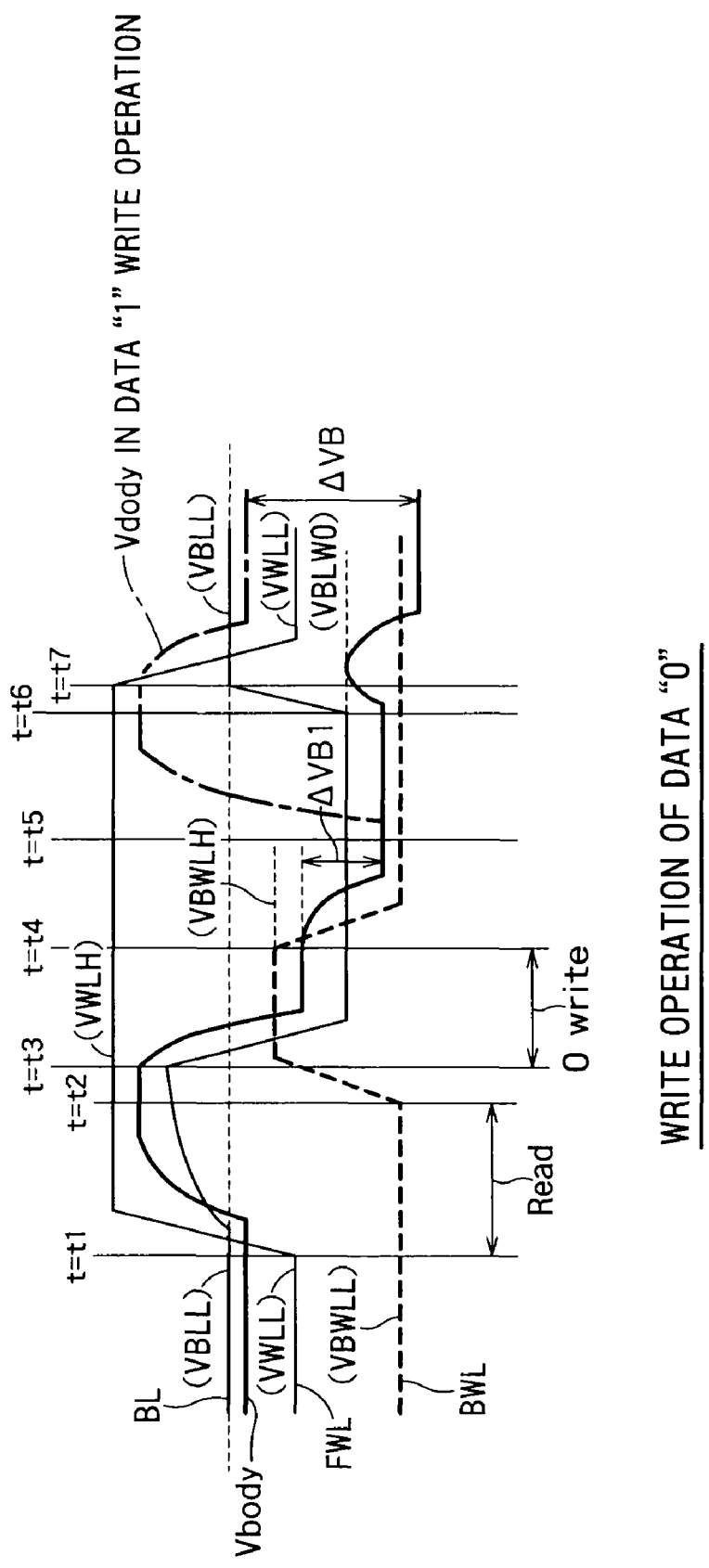
FIG. 4 is a timing diagram showing a writing operation of the data "0" into the memory cells MCs.

The sense amplifier S/A writes the data "0" into the memory cells MCs of all columns (all bit lines) connected to the selected pair of word lines SWL, BWL. As a result, the data "0" is written into the memory cells MCs. Thereafter, the sense amplifier S/A writes the data "1" into the memory cells MCs of the column selected to write the data "1". As a result, the data "1" is selectively written into the memory cells MCs. That is, while the data "0" writing operation is completed by performing the writing of the data "0", the data "1" writing operation is completed by performing the writing of the data "1" after once performing the writing of the data "0". FIG. 3 and FIG. 4 show the data "0" writing operation at times t3 to t4, and the data "1" writing operation at times t5 to t6.

[Data "1" Writing Operation]

FIG. 3 is a timing diagram showing a writing operation of the data "1" into the memory cells MCs. The data "1" writing operation is performed by writing the data "1" into the memory cells MCs after once writing the data "0" into the memory cells MCs.

A source potential VSL is fixed to the ground potential (0 V). The memory cells MCs are in a data holding state before time t1. In the data holding state, the potential of the bit lines BLs is VBLL which is the same as the source potential VSL. A potential of the front word lines FWLs is a negative potential VWLL lower than the source potential VSL. A potential of the back word lines BWLs is a negative potential VBWLL lower than the potential VWLL. A potential Vbody of the body 50 is a negative potential based on a capacitance coupling between the body 50 and the front word lines FWLs and a capacitance coupling between the body 50 and the back word lines BWLs. As a result, holes are held within the body 50 in the "1" cell.

During a period from t1 to t2, the sense amplifier S/A is performing the data reading operation. In this example, the sense amplifier S/A is reading the data "1". More specifically, at t1, the WL driver WLD increases the potential of the front word lines FWLs from VWLL to VWLH. As a result, a transistor at the front word line side becomes in the on state. Thereafter, the sense amplifier S/A slightly increases a potential of the bit lines BLs. As a result, the sense amplifier S/A compares driving currents of the memory cells MCs, and detects data stored in the memory cells MCs. The number of holes in the body 50 of the "0" cell is small and the body potential Vbody is low. As a result, a threshold voltage of the "0" cell is high. Accordingly, a driving current of the "0" cell is small. On the other hand, many holes are accumulated in the body 50 of the "1" cell. Therefore, the body potential Vbody is high and the threshold voltage is low. Accordingly, a driving current of the "1" cell is large. The sense amplifier S/A detects a difference between a driving current in the "0" cell and a driving current in the "1" cell.

After reading the data, the FBC memory according to the first embodiment first writes the data "1" at first to fourth stages. First, at t2 to t3 (first stage), the WL driver WLD bumps up the voltage of the back gate electrode BWL from VBWLL to VBWLH. At this time, the body potential Vbody attempts to increase based on the capacitance coupling between the body 50 and the back word lines BWLs. However, at the data reading time, the body potential Vbody is in a voltage state higher than the source potential VSL by a flat band voltage VF. Therefore, the body potential Vbody does not increase and does not change. Even when the body potential Vbody is attempted to be increased, holes within the body 50 flow out to the source 60 as a forward current.

At t3 to t4 (second stage), the data "0" is written in the state that the potential of the back word lines BWLs is bumped up to VBWLH. At t3, the sense amplifier S/A lowers the potential of the bit lines BLs to VBLW0 (<VSL) in the state that the potential of the front word lines FWLs is maintained at VWLH. At this time, the body potential Vbody becomes higher than the potential of the drain 40. Therefore, a sequential bias is applied to a pn junction between the body and the drain, and positive holes are extracted from the body 50 to the drain 40. The body potential Vbody is lowered to a level higher by VF than the potential of the drain 40.

At t4 to t5 (third stage), the WL driver WLD bumps down the potential of the back word lines BWLs from VBWLH to VBWLL. At this time, the body potential Vbody of the "0" cell is lowered by ΔVB1 based on the capacitance coupling between the body 50 and the back word lines BWLs.

At t5 to t6 (fourth stage), the data "1" is written. At t5, the sense amplifier S/A increases the potential of the bit lines BLs from VBLW0 to VBLW1 while maintaining the potential of the front word lines FWLs at VWLH. VBLW1 is a voltage sufficient enough for the transistor at the front word line side to perform a pentode operation. Based on the pentode operation, an impact ionization is generated near the junction between the body and the drain and holes are implanted into the body 50. As a result, the body potential Vbody increases to a potential higher by VF than the source potential VSL.

Thereafter, at t6, the potential of the bit lines BLs is returned to VBLL. At t7, the potential of the front word lines FWLs is lowered to VWLL. As a result, the memory cell MC enters a data holding state. At this time, the body potential Vbody of the "1" cell is lowered based on the capacitance coupling between the body 50 and the front word lines FWLs and the capacitance coupling between the body and the drain.

[Data "0" Writing Operation]

FIG. 4 is a timing diagram showing a writing operation of the data "0" into the memory cells MCs. In the data "0" writing operation, the data "1" is not written into the memory cells MCs after the data "0" is written into the memory cells MCs. With this arrangement, the memory cells MCs are set to the "0" cells. The data "0" writing operation is the same as the data "1" writing operation up to time t5 (the third stage).

Thereafter, at t5 to t6 (the fourth stage), the data "1" is not written. That is, at t5, the WL driver WLD maintains the potential of the front word lines FWLs at VWLH and the sense amplifier S/A maintains the potential of the bit lines BLs at VBLW0. Therefore, the body potential Vbody is not changed at the fourth stage.

Thereafter, at t6, the potential of the bit lines BLs is returned to VBLL and the potential of the front word lines FWLs is lowered to VWLL at t7. As a result, the memory cell MC enters a data holding state. At this time, the body potential Vbody of the "0" cells is lowered based on the capacitance coupling between the body 50 and the front word lines FWLs and the capacitance coupling between the body and the drain.

A dashed line shown in FIG. 4 indicates a body potential at and after t5 in the data "1" writing operation shown in FIG. 3. A difference between the body potential of the "0" cell and the body potential of the "1" cell in the data holding state is ΔVB.

Figure 5:
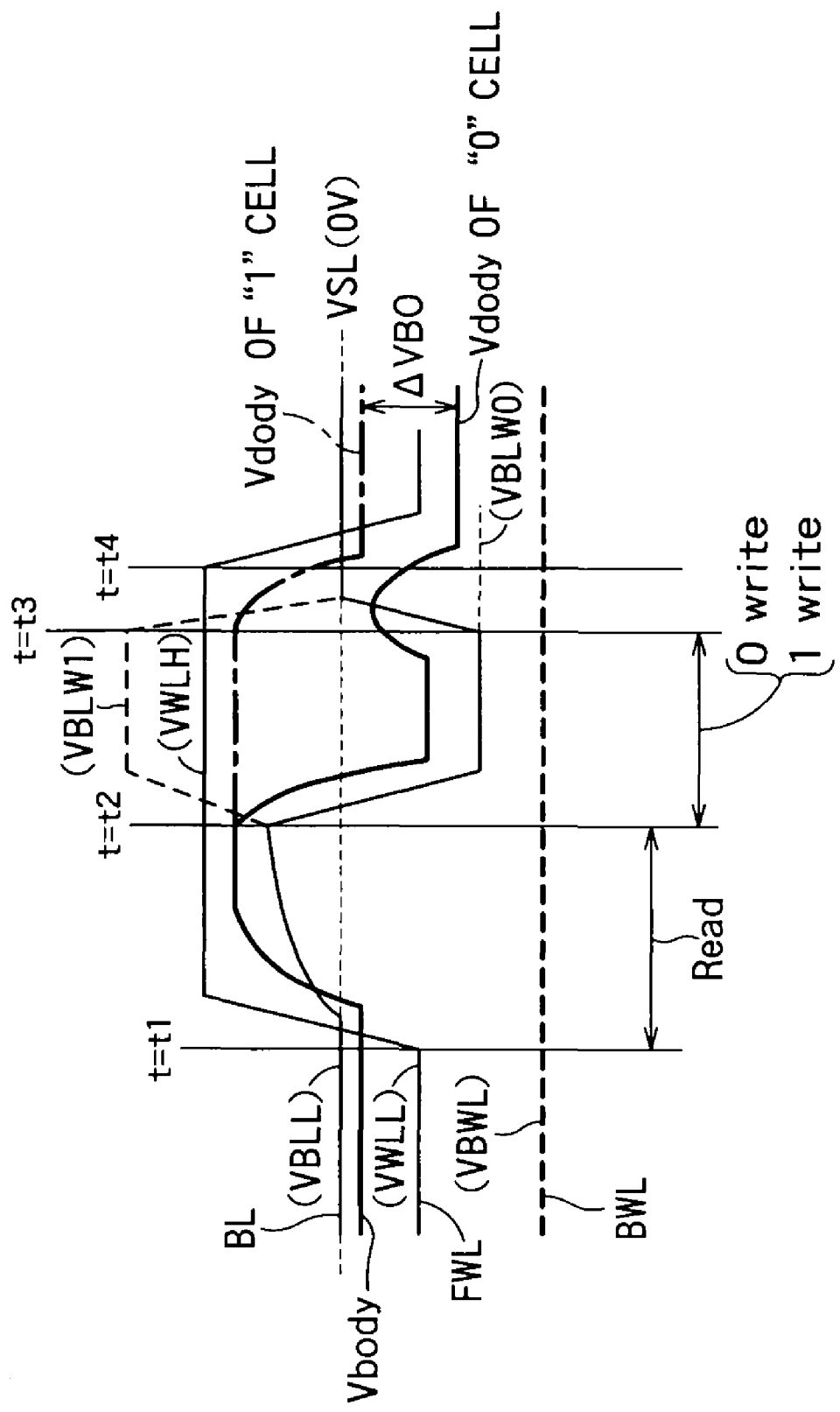
FIG. 5 is a timing diagram showing a conventional data writing operation of writing data into the FBC memories.

FIG. 5 is a timing diagram showing a conventional data writing operation of writing data into the FBC memories. To increase the speed of data writing, the writing of the data "1" and the writing of the data "0" are performed simultaneously. A potential of the bit lines BLs shown by a solid line indicates the data "0" writing potential VBLW0, and a potential of the bit lines BLs shown by a broken line indicates the data "1" writing potential VBLW1.

Figure 6:
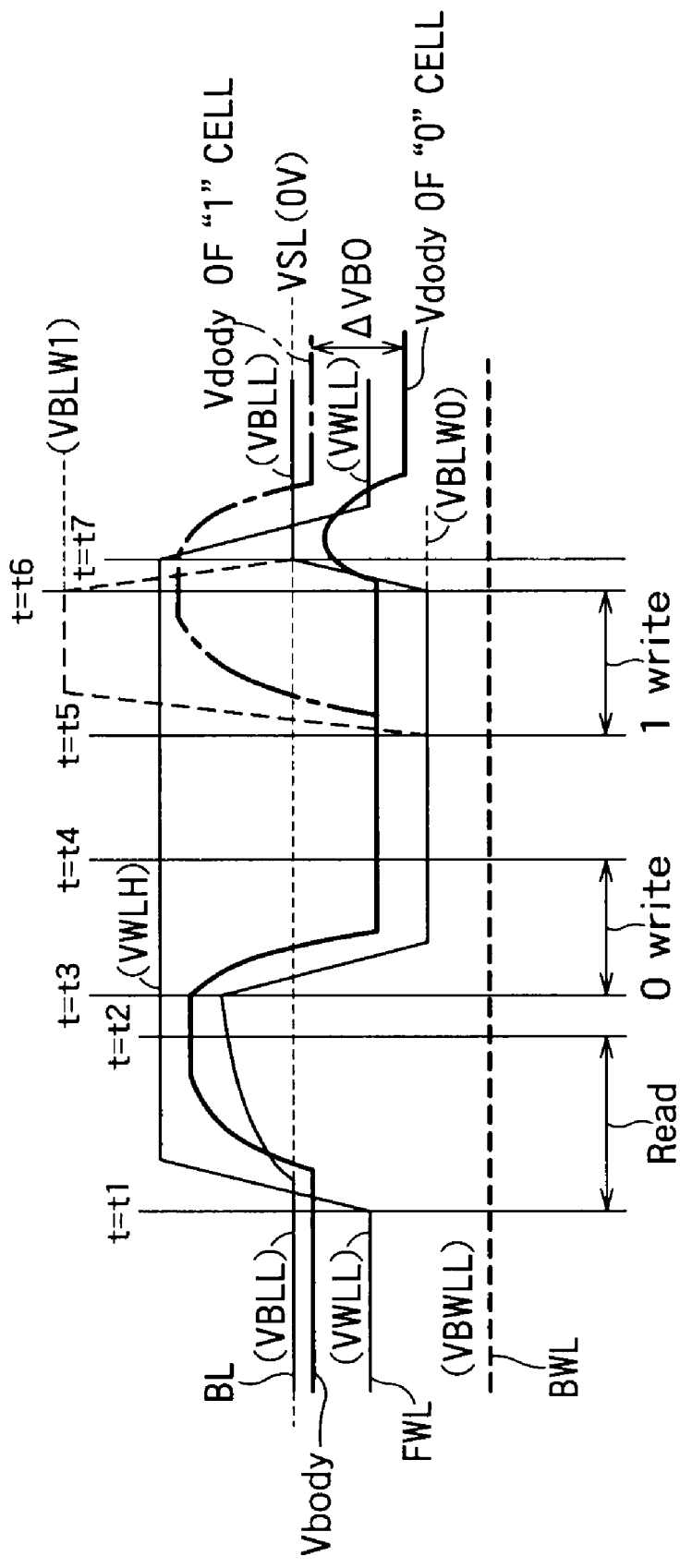
FIG. 6 is a timing diagram showing a data writing operation of writing data into the FBC memories according to a comparative example.

FIG. 6 is a timing diagram showing a data writing operation of writing data into the FBC memories according to a comparative example. The comparative example shown in FIG. 6 shows a result that the conventional operations of writing the data "1" and writing the data "0" are performed separately. As shown in FIG. 6, even when the writing of the data "1" and the writing of the data "0" are performed separately, a difference between the body potential in the "0" cell and the body potential in the "1" cell is the same as that shown in FIG. 5. In the comparative example, the operation of the potential of the bit lines BLs and the operation of the potential of the front word lines FWLs are the same as the operations shown in FIG. 3 or FIG. 4. However, the comparative example is different from the first embodiment shown in FIG. 3 or FIG. 4 in that the potential of the back word lines BWLs is fixed in the comparative example. That is, FIG. 6 corresponds to a timing diagram when the potential of the back word lines BWLs is fixed in FIG. 3 and FIG. 4.

In FIG. 6, at t5 to t6, a potential of the bit lines BLs shown by a solid line indicates the writing potential VBLW0 of the data "0" and a potential of the bit line BLs shown by a broken line indicates the writing potential VBLW1 of the data "1".

Note that the difference ΔVB between the body potential of the "0" cell and the body potential of the "1" cell shown in FIG. 4 is larger than a difference ΔVB0 between the body potential of the "0" cell and the body potential of the "1" cell shown in FIG. 6. ΔVB is substantially equal to ΔVB0+ΔVB1. As explained with reference to FIG. 3 and FIG. 4, ΔVB1 is the body potential Vbody (coupling fall potential) fell based on the capacitance coupling between the body 50 and the back word lines BWLs when the potential of the back word lines BWLs is bumped down.

That is, the FBC memory according to the first embodiment can increase the body potential difference between the "0" cell and the "1" cell more than that of conventional FBC memories by bumping-down the potential of the back word lines BWLs after writing the data "0". In other words, the FBC memory according to the first embodiment can increase the signal difference between the "0" cell and the "1" cell more than that of conventional FBC memories.

In FIG. 3, to simplify the explanation, the data "0" is once written into the memory cell MC becoming the "1" cell. However, basically, the data "0" does not need to be written into the memory cell MC becoming the "1" cell. Therefore, to save power, the potential of the bit lines BLs connected to the memory cells MCs becoming the "1" cells can be held higher than (for example VBLW1) than VBLW0 at t3 to t5.

Figure 7:
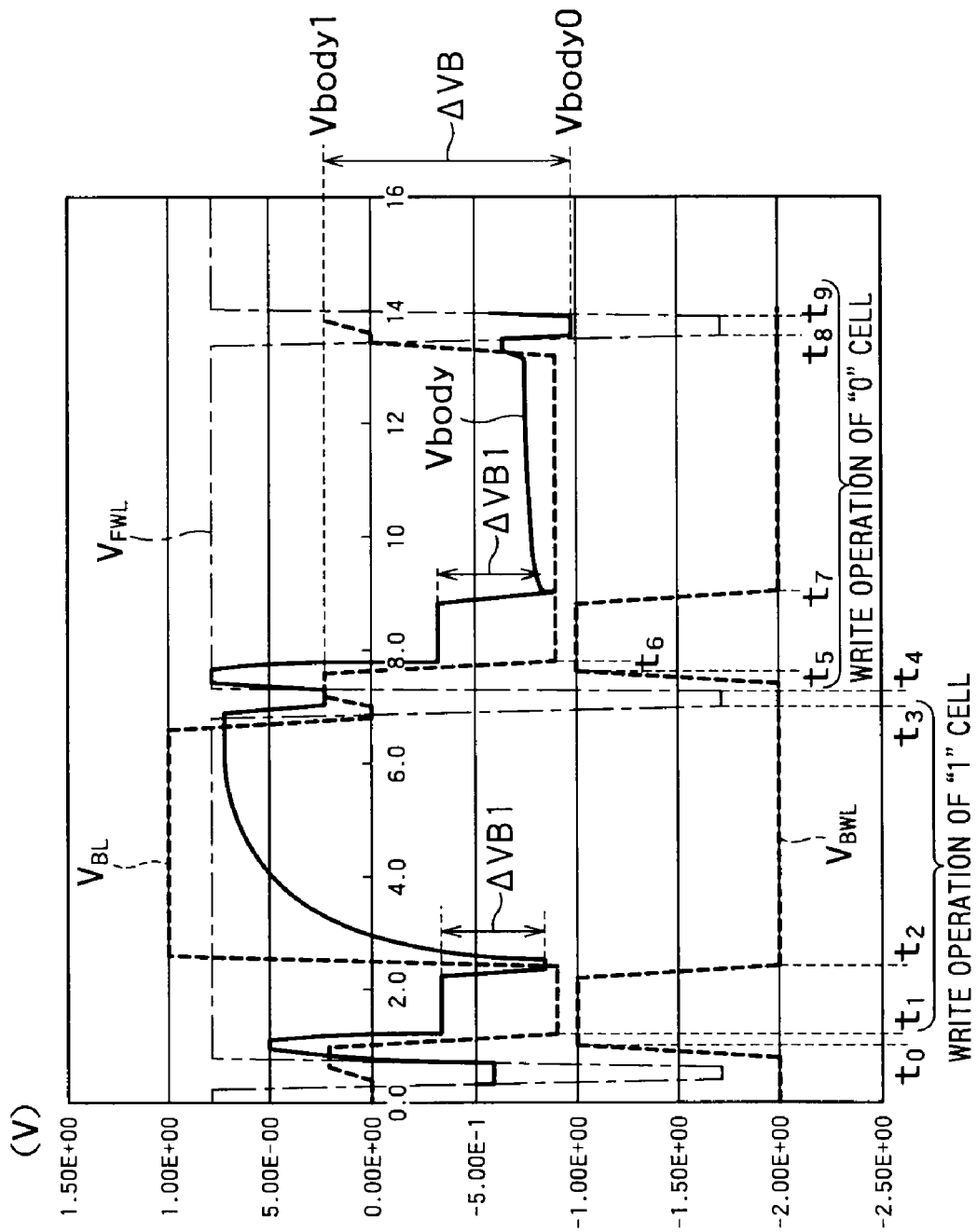
FIG. 7 is a timing diagram showing a data writing operation of writing data into the FBC memories according to the first embodiment.
Figure 8:
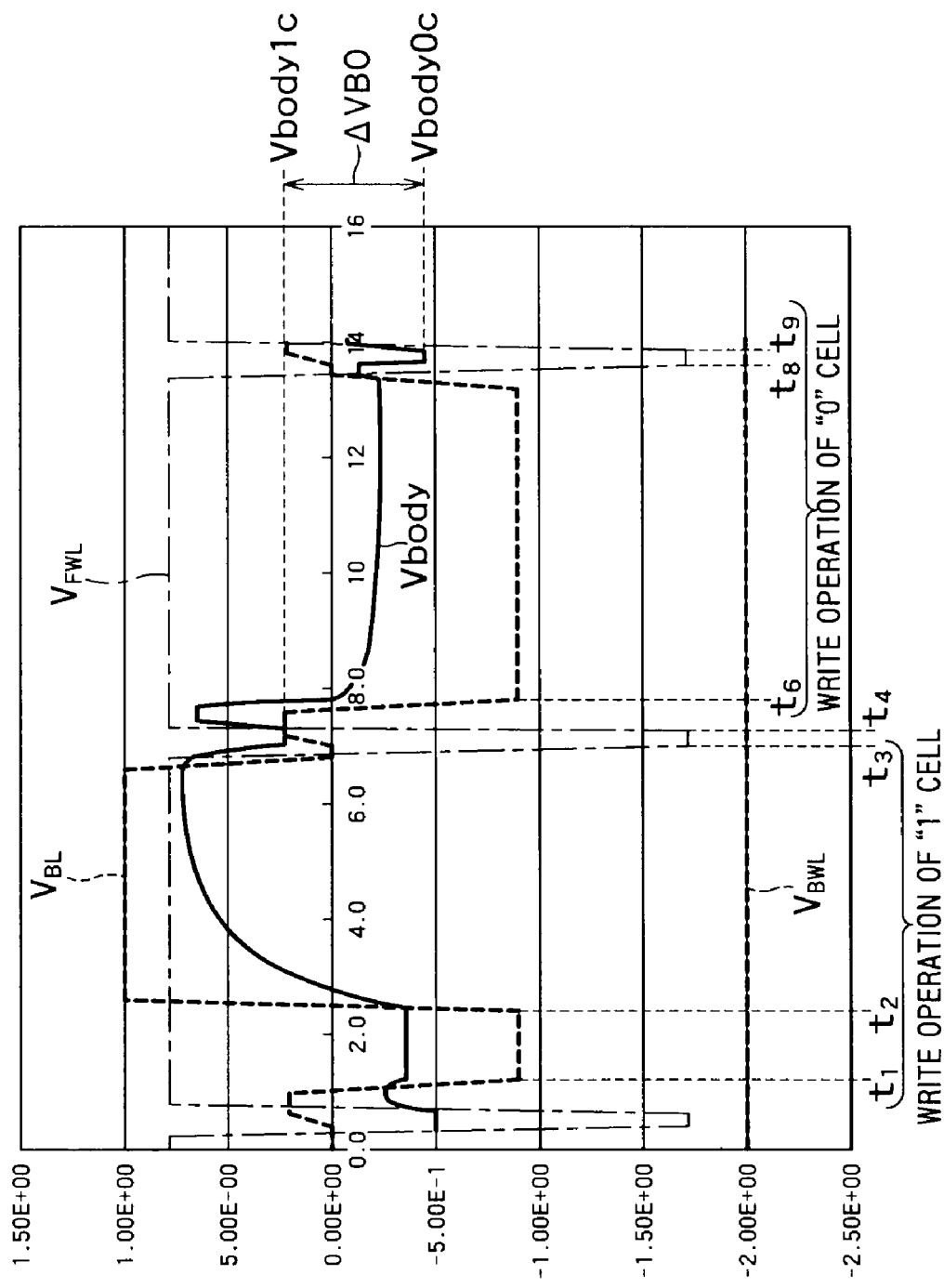
FIG. 8 is a timing diagram showing a data writing operation of writing data into the FBC memories according to a comparative example.

Graphs shown in FIG. 7 and FIG. 8 represent simulation results. A thickness of each film of the first gate dielectric film 71 and the second gate dielectric film 72 of the FBC memory used in this simulation is 1.6 nm. A film thickness (a distance from the first gate dielectric film 71 to the second gate dielectric film 72) of the SOI layer 30 is 21 nm. A detailed example is explained with reference to the simulation results shown in FIG. 7 and FIG. 8.

[Data "1" Writing Operation]

First, before t0, data is read out from the memory cell MC to the sense amplifier S/A. In the reading operation, the potential VFWL of the front word lines FWLs is set to 0.8 V, the potential VBL of the bit lines BLs is set to 0.2 V and the potential VBWL of the back word lines BWLs is set to −2 V. In this case, the back word voltage VBWL is equal to the back word voltage at the data holding time. The potential of the source line SL is maintained at the ground potential. As a result, the memory cells MCs operate in a linear region. The "0" cell and the "1" cell are different in threshold voltages of the memory cell MC based on a difference of numbers of holes accumulated in the bodies 50. By detecting a difference between the threshold voltages, the data "1" and the data "0" are identified. The bit lines BLs are set to low voltages at the reading time for the following reason. When the voltages of the bit lines BLs are set high to bias the memory cells MCs in a saturation state, the "0" cell has a risk of being changed to the "1" cell due to the impact ionization at the time of reading the data "0".

Next, at t0 to t3, data is written into the "1" cell. In the operation of writing data into the "1" cell, the sense amplifier S/A once writes the data "0", and thereafter writes the data "1". In the data "0" writing operation, the WL driver WLD bumps up the back word voltage VBWL so that the back word voltage VBWL becomes closer to the source potential than the voltage at the data holding time. More specifically, at t0, the WL driver WLD bumps up the back word voltage VBWL from the potential −2 V at the data holding time to −1 V. As a result, the body potential Vbody increases based on the capacitance coupling between the body 50 and the back word lines BWLs. At t1, the sense amplifier S/A lowers the bit voltage VBL to −0.9 V. As a result, a sequential bias is applied to between the body and the drain and the holes in the body 50 are discharged to the drain 40 (extinguished). During a period while the holes are extinguished from the body 50, the body potential Vbody maintains substantially a constant value. Thereafter, when all holes within the body 50 are extinguished, the body potential Vbody is lowered toward the bit voltage VBL based on the capacitance coupling between the body and the drain, as shown at t2. The data "0" is written into the memory cells MCs in this way.

At t2, the WL driver WLD returns (bumps down) the back word voltage VBWL from −1 V to the back word voltage −2 V at the data holding time. That is, after writing the data "0", the WL driver WLD returns the back word voltage VBWL to a state (a data holding state) more separated from the source potential than from the voltage VBLW at the data "0" writing time. In the state that the back word voltage VBWL is returned to the voltage in the data holding time in this way, the data "1" is written next as follows. When the back word voltage VBWL is bumped down, the body potential Vbody becomes lower by ΔVB1 (about 0.6 V) based on the capacitance coupling between the body 50 and the back word lines BWLs.

In the data "1" writing, the sense amplifier S/A increases the bit voltage VBL to a high-level potential (1 V). At this time, the front word voltage VFWL is also at a high-level potential (0.8 V). Therefore, an impact ionization is generated near the junction between the body and the drain of the memory cells MCs. Based on the impact ionization, a large amount of electron and hole pairs is generated. The electrons generated by the impact ionization flow to the drain and they are accumulated in the body of low potential. The body potential Vbody reaches a balanced state when the current flowing at the time of generating holes by the impact ionization is balanced with the forward current at a pn junction between the body and the source. At t2 to t3, the body potential Vbody increases, and near t3, the body potential Vbody reaches a balanced state. The data "1" is written into the memory cells MCs in this way.

At around t3 to t4, a period of the data holding state of the "1" cell and a period of the reading operation of the "1" cell are included. In the data holding state, the WL driver WLD maintains the back word voltage VBWL at a low level potential (−2 V) and lowers the front word voltage VFWL to a low level potential (−1.7 V). At this time, the bit voltage VBL is equal to the source potential (the ground potential). A body potential Vbody1 in the data holding state of the "1" cell is about 0.25 V.

In the data reading operation, the bit voltage VBL is 0.25 V and the front word voltage VFWL is 0.8 V. The back word voltage VBWL maintains −2 V. As a result, the data "1" is read. The data reading operation is as described above. In the present simulation, the data holding period is set to a very short period. This is because it is sufficient when the body potential Vbody during the data holding period becomes clear. In the actual operation, the data holding period can be longer than that in the present simulation.

[Data "0" Writing Operation]

Next, at t5 to t7, data is written into the "0" cell. In the "0" cell writing operation, the WL driver WLD bumps up the back word voltage VBWL to a level closer to the source potential than the voltage at the data holding time, and thereafter the sense amplifier S/A writes the data "0". The data "1" is not written after that. More specifically, at t5, the WL driver WLD bumps up the back word voltage VBWL from the potential −2 V at the data holding time to −1 V. As a result, the body potential Vbody increases based on the capacitance coupling between the body 50 and the back word lines BWLs. At t6, the sense amplifier S/A lowers the bit voltage VBL to −0.9 V. As a result, a sequential bias is applied to between the body and the drain and the holes in the body 50 are discharged to the drain 40 (extinguished). During a period while the holes are extinguished from the body 50 (t6 to t7), the body potential Vbody maintains substantially a constant value. Thereafter, when all holes within the body 50 are extinguished, the body potential Vbody is lowered toward the bit voltage VBL based on the capacitance coupling between the body and the drain, as shown at t7. The data "0" is written into the memory cells MCs in this way.

At t7, the WL driver WLD returns (bumps down) the back word voltage VBWL from −1 V to the back word voltage −2 V at the data holding time. That is, after writing the data "0", the WL driver WLD returns the back word voltage VBWL to a state (a data holding state) more separated from the source potential than from the voltage VBLW at the data "0" writing time. In this way, the "0" cell is held in the state that the back word voltage VBWL is returned to the voltage in the data holding time. When the back word voltage VBWL is bumped down, the body potential Vbody becomes lower by ΔVB1 (about 0.5 V) based on the capacitance coupling between the body 50 and the back word lines BWLs.

During a period from t7 to t8, the data "1" is written into other memory cells (see t2 to t3). Thereafter, during t8 to t9, a period of the data holding state of the "0" cell and a period of the reading operation of the "0" cell are included. In the data holding state, the WL driver WLD maintains the back word voltage VBWL at a low level potential (−2 V) and lowers the front word voltage VFWL to a low level potential (−1.7 V). At this time, the bit voltage VBL is equal to the source potential (the ground potential). A body potential Vbody0 in the data holding state of the "1" cell is about −1 V.

That is, the difference ΔVB between the body potential of the "1" cell and the body potential of the "0" cell in the data holding state of the FBC memory is about 1.25 V.

FIG. 8 is a timing diagram showing a conventional data writing operation of writing data into the FBC memory. In the simulation shown in FIG. 8, the back word voltage VBWL is fixed to a low-level potential (−2 V). The operations at the front word voltage VFWL and the bit voltage VBL are the same as those shown in FIG. 7.

The body potential Vbody1 of the "1" cell in the data holding state is about 0.25 V and this voltage is the same as that of the first embodiment. However, the body potential Vbody0 of the "0" cell in the data holding state is about −0.4 V and it is higher than that of the first embodiment (near the source potential). That is, the difference ΔVB0 between the body potential of the "1" cell and the body potential of the "0" cell in the data holding state of the conventional FBC memory is about 0.65 V.

That is, in the above simulation, ΔVB (1.25 V) is equal to ΔVB0+ΔVB1 (0.65+0.6 V). As explained above, it is clear that in the simulation, the signal amount ΔVB of the FBC memory according to the first embodiment also becomes larger than the signal amount ΔVB0 of the conventional FBC memory by ΔVB1. ΔVB1 is a coupling fall potential of the body potential Vbody due to the bump down of the back word lines BWLs at the time of writing the data "0" based on the capacitance coupling between the body 50 and the back word lines BWLs.

A difference between the body potential of the "1" cell and the body potential of the "0" cell of the FBC memory according to the first embodiment becomes larger than the difference between the body potentials of the conventional FBC memory. This is for the following reason. At the time of writing the data "0", the WL driver WLD increases the back word voltage VBWL to bring the back word voltage VBWL closer to the source potential (the ground potential) than VBWL at the data holding time. As a result, based on the capacitance coupling between the body 50 and the back word lines, a sequential bias larger than the conventional sequential bias is applied to between the body and the drain, and more holes are discharged (extinguished) from the body 50. Further, after writing the data "0", the back word voltage VBWL is bumped down to the potential in the data holding state. At this time, the body potential Vbody decreases to a lower potential than the conventional potential, based on the capacitance coupling between the body 50 and the back word lines. As a result, the body potential Vbody0 is maintained at a lower level than the conventional level even when a state changes to the data holding state.

The body potential Vbody0 of the "0" cell in the data holding state is lower than the conventional body potential by ΔVb. In this case, ΔVb is substantially equal to a fall voltage of the body potential Vbody based on the capacitance coupling between the body 50 and the back word lines when the back word voltage VBLW is bumped down at t7 in FIG. 7.

Meanwhile, the data "1" writing operation is performed to accumulate holes into the body 50 by impact ionization or GIDL (Gate Induced Drain Leakage). Immediately after the data "0" is written, the body potential Vbody in the first embodiment becomes lower than the conventional body potential. Therefore, by the impact ionized current and the GIDL current, holes are accumulated fast into the body 50 and the body potential Vbody increases faster than the conventional speed as shown immediately after t2 in FIG. 7. Accordingly, even when the data "1" writing time (t2 to t3) is about the same as the conventional time, the data "1" can be sufficiently written into the memory cells MCs.

Figure 9:
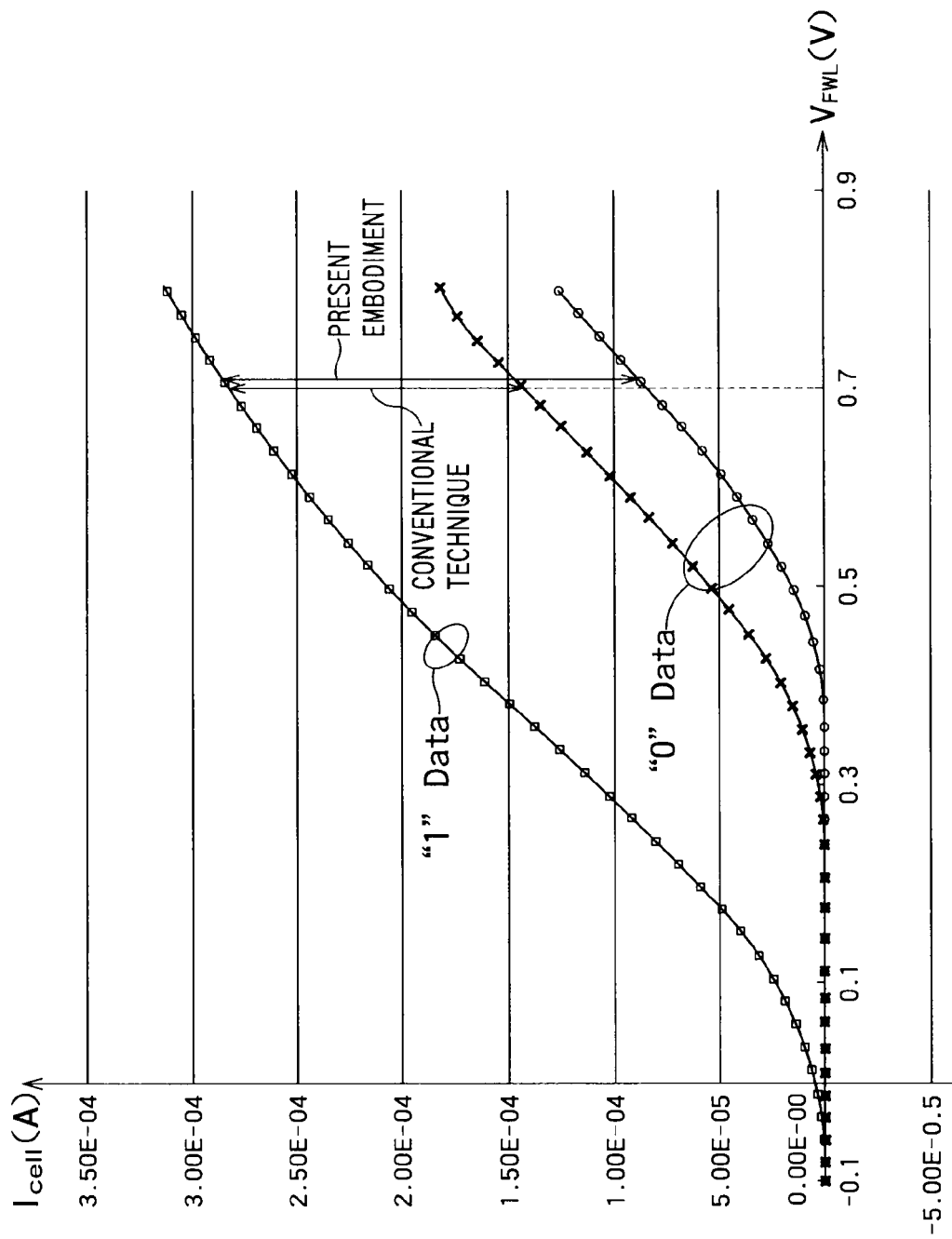
FIG. 9 is a graph showing a reading signal difference as a result of the simulations shown in FIG. 7 and FIG. 8.

FIG. 9 is a graph showing a reading signal difference as a result of the simulations shown in FIG. 7 and FIG. 8. The vertical axis shows a current Icell flowing through the memory cells MCs at the reading operation time. The horizontal axis shows a voltage VFWL of the front word lines FWLs. When the front word line voltage VFWL is 0.7 V, for example, the difference between the cell current Icell of the "1" cell and the cell current Icell of the "0" cell according to the first embodiment shown in FIG. 7 is larger than the difference between the cell current Icell of the "1" cell and the cell current Icell of the "0" cell in the conventional example shown in FIG. 8. The fact that the difference between the cell currents is large means that a signal difference between the "1" cell and the "0" is large.

Second Embodiment

Figure 10:
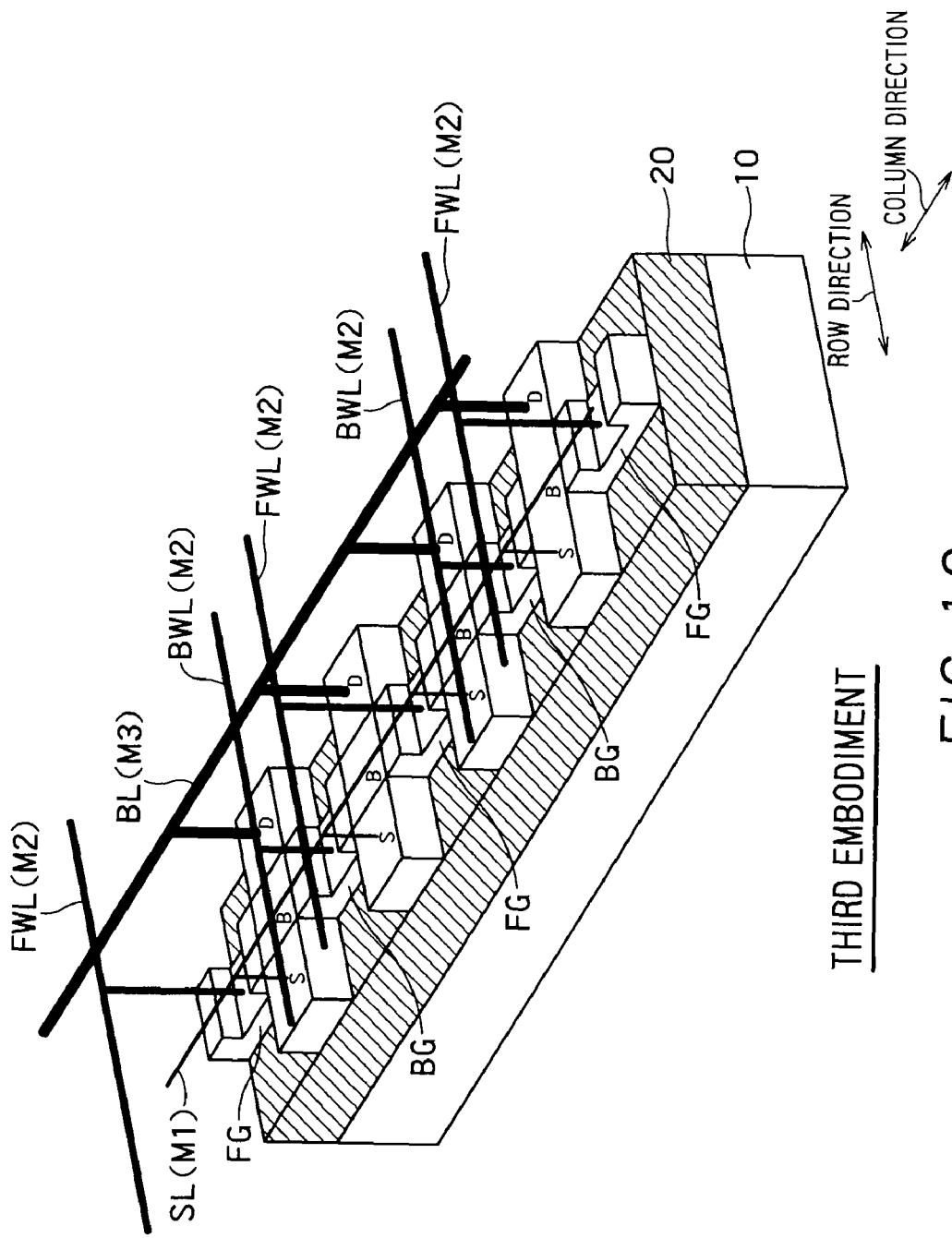
FIG. 10 and FIG. 11 are perspective views showing a configuration of an FBC memory according to a second embodiment of the present invention.
Figure 11:
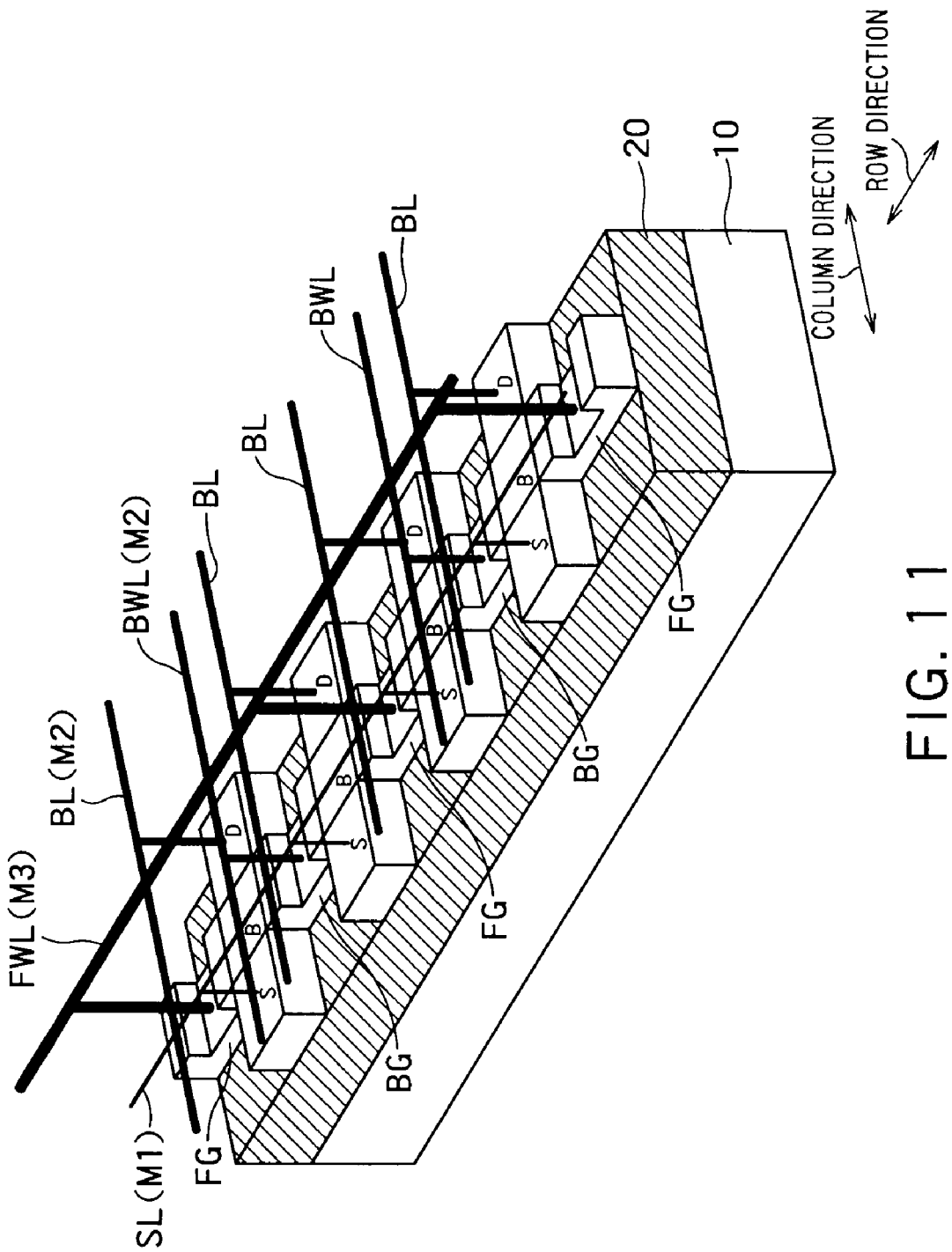

FIG. 10 and FIG. 11 are perspective views showing a configuration of an FBC memory according to a second embodiment of the present invention. In the second embodiment, the Fin-type FET is used as the memory cells MCs. In the first embodiment, the memory cells MCs are a flat-type FET, and the front word lines FWLs and the back word lines BWLs face the upper surface and the bottom surface, respectively of the body 50. On the other hand, in the second embodiment, the front word lines FWLs and the back word lines BWLs face side surfaces, respectively of the body 50. Following this, a first gate dielectric film and a second gate dielectric film (not shown) are provided between the front word lines FWLs and the body 50 and between the back word lines BWLs and the body 50, respectively.

In an FBC memory shown in FIG. 10, the source line SL and the bit lines BLs extend to the same direction (a column direction) and the front word lines FWLs and the back word lines BWLs extend to a row direction orthogonal with the column direction. The source line SL is formed by a first metal layer (a lower layer metal) M1. The front word lines FWLs and the back word lines BWLs are formed by second metal layers (intermediate metal layers) M2, respectively. The bit lines BLs are formed by a third metal layer (an upper layer metal) M3. The source line SL, the front word lines FWLs, the back word lines BWLs, and the bit lines BLs are made of a metal such as copper, aluminum, and tungsten.

In the FBC memory shown in FIG. 11, the source line SL and the front word lines FWLs extend to the same direction (a row direction) and the bit line BLs and the back word lines BWLs extend to a column direction orthogonal with the row direction. The source line SL is formed by the first metal layer (the lower layer metal) M1. The bit lines BLs and the back word lines BWLs are formed by the second metal layers (the intermediate metal layers) M2, respectively. The front word lines FWLs are formed by the third metal layer (the upper layer metal) M3.

Other configurations and operations in the second embodiment can be similar to the configurations and the operations in the first embodiment. The data writing operation in the first embodiment can be also performed to the FBC memory using the Fin-type FET as the memory cell MC. Therefore, the second embodiment can obtain similar effects to those of the first embodiment.

In the case of this Fin-type FBC, preferably, a film thickness of the second gate dielectric film is equal to the film thickness of the first gate dielectric film. With this arrangement, there are advantages that the first and second gate dielectric films can be formed simultaneously and the FBC memory can be manufactured easily.

In the second embodiment, the memory cells MCs can be a p-type FET. In this case, the body 50 accumulates electrons or discharges electrons. Polarities of potentials of the front word lines FWLs, the back word lines BWLs, and the bit lines BLs become opposite to those of the first embodiment.

The invention claimed is:

1. A semiconductor memory device comprising:
a semiconductor layer;

a source layer and a drain layer provided in the semiconductor layer;

a body region provided in the semiconductor layer between the source layer and the drain layer in an electrically floating state, and storing logic data based on a charge amount accumulated therein;

a first gate dielectric film provided on a first surface of the body region;

a first gate electrode provided on the first surface via the first gate dielectric film;

a second gate dielectric film provided on a second surface of the body region different from the first surface;

a second gate electrode provided on the second surface via the second gate dielectric film;

a driver driving the first gate electrode and the second gate electrode; and a sense amplifier reading logic data from or writing logic data into memory cells including the source layer, the drain layer, and the body region, wherein the sense amplifier writes into the memory cells first logic data in a state that a voltage of the second gate electrode at a data writing time is brought closer to a potential of the source layer than a voltage of the second gate electrode at a data holding time, carriers in the body regions of the memory cells being discharged from the body regions during a writing operation of the first logic data.

2. The semiconductor memory device according to claim 1, wherein the sense amplifier writes into the memory cells second logic data in a state that a voltage of the second gate electrode at a data writing time is returned from the voltage of the second gate electrode at the time of writing the second logic data to a voltage of the second gate electrode at a data holding time, carriers being charged in the body region of the memory cells during a writing operation of the second logic data.

3. The semiconductor memory device according to claim 1, further comprising:

a front word line connected to the first gate electrode;

a back word line connected to the second gate electrode; and a bit line connected to the drain layer, wherein the front word line and the back word line are parallel with each other and are substantially orthogonal with the bit line.

4. The semiconductor memory device according to claim 2, further comprising:

a front word line connected to the first gate electrode;

a back word line connected to the second gate electrode; and a bit line connected to the drain layer, wherein the front word line and the back word line are parallel with each other and are substantially orthogonal with the bit line.

5. The semiconductor memory device according to claim 2, wherein the sense amplifier writes the second logic data into the memory cells after the writing operation of the first logic data, in the writing operation of the second logic data, the sense amplifier writes the second logic data into memory cells selected from the memory cells into which the first logic data is written.

* * * * *